(12) United States Patent
Khalsa et al.

(10) Patent No.: US 7,971,174 B1
(45) Date of Patent: Jun. 28, 2011

(54) CONGESTION AWARE PIN OPTIMIZER

(75) Inventors: Mahendra Singh Khalsa, Noida (IN); Sanjib Ghosh, Greater Noida (IN); Vandana Gupta, Delhi (IN); Hitesh Marwah, Noida (IN); Pawan Fangaria, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 422 days.

(21) Appl. No.: 12/233,414

(22) Filed: Sep. 18, 2008

(51) Int. Cl.
*G06F 17/50* (2006.01)
(52) U.S. Cl. ............ 716/129; 716/118; 716/130
(58) Field of Classification Search .......... 716/118, 716/129, 130
See application file for complete search history.

(56) References Cited

U.S. PATENT DOCUMENTS

| | | | | |
|---|---|---|---|---|
| 4,484,292 A * | 11/1984 | Hong et al. | | 716/129 |
| 5,311,443 A * | 5/1994 | Crain et al. | | 716/122 |
| 6,493,658 B1 * | 12/2002 | Koford et al. | | 703/1 |
| 6,618,846 B2 * | 9/2003 | Cheng | | 716/115 |
| 6,857,107 B2 * | 2/2005 | Nagasaka et al. | | 716/113 |
| 6,857,116 B1 * | 2/2005 | Dahl et al. | | 716/125 |
| 7,076,406 B1 * | 7/2006 | Tetelbaum | | 703/2 |
| 7,114,142 B1 * | 9/2006 | Segal et al. | | 716/129 |
| 7,340,711 B2 * | 3/2008 | Hetzel et al. | | 716/130 |
| 7,661,085 B2 * | 2/2010 | Cho et al. | | 716/129 |
| 2001/0038612 A1 * | 11/2001 | Vaughn et al. | | 370/256 |
| 2005/0076319 A1 * | 4/2005 | Chow et al. | | 716/10 |
| 2005/0268258 A1 * | 12/2005 | Decker | | 716/4 |
| 2008/0115099 A1 * | 5/2008 | Patra | | 716/13 |
| 2009/0319977 A1 * | 12/2009 | Saxena et al. | | 716/13 |

* cited by examiner

*Primary Examiner* — Naum Levin
(74) *Attorney, Agent, or Firm* — Silicon Valley Patent Group; Thomas Chan

(57) ABSTRACT

A circuit design process for the reduction of routing congestion is described. This process includes a block placement operation, an initial pin optimization for the block placement, and global routing based upon the initial pin optimization. Congestion data is generated from the global routing and, in an automated process, the pins are re-optimized, based upon the congestion data. This process can be used as part of a custom layout design process, for example.

18 Claims, 14 Drawing Sheets

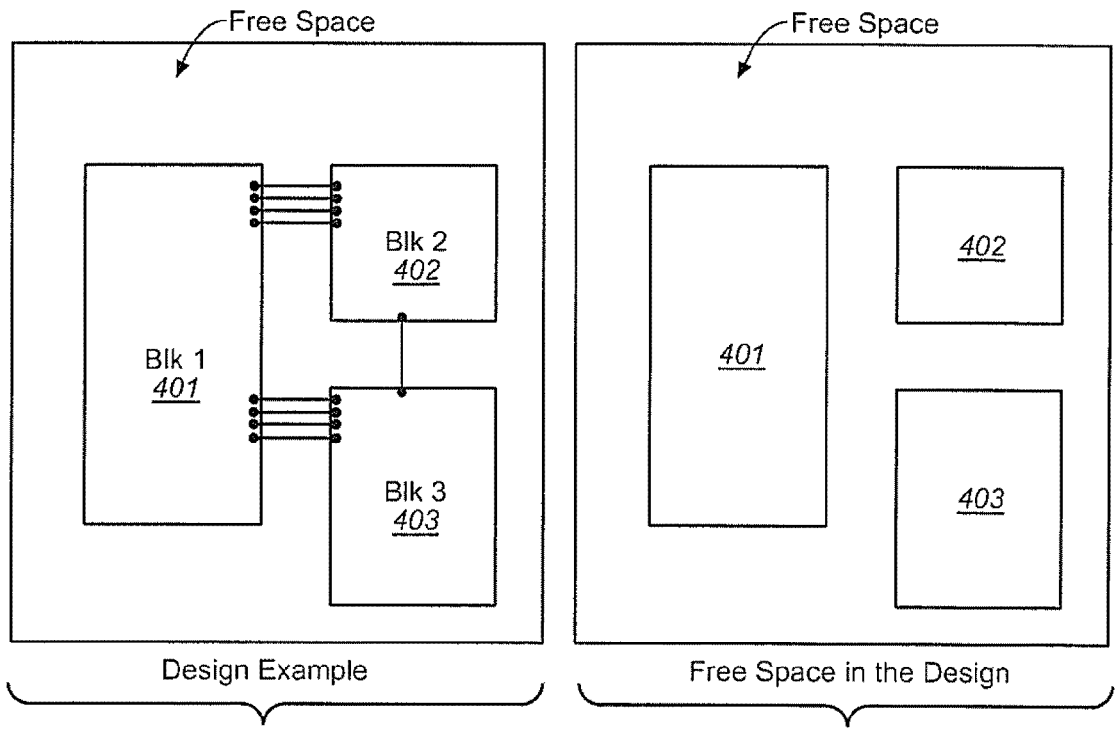
FIG. 4A — Design Example
FIG. 4B — Free Space in the Design
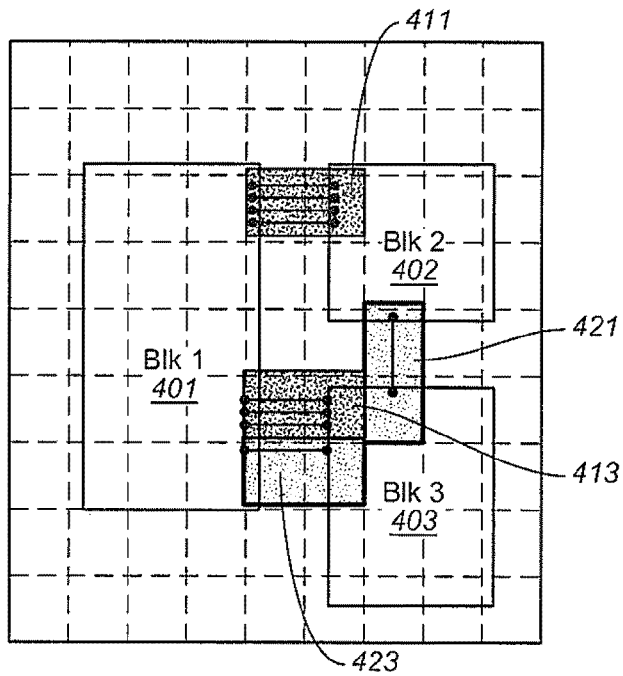
FIG. 5

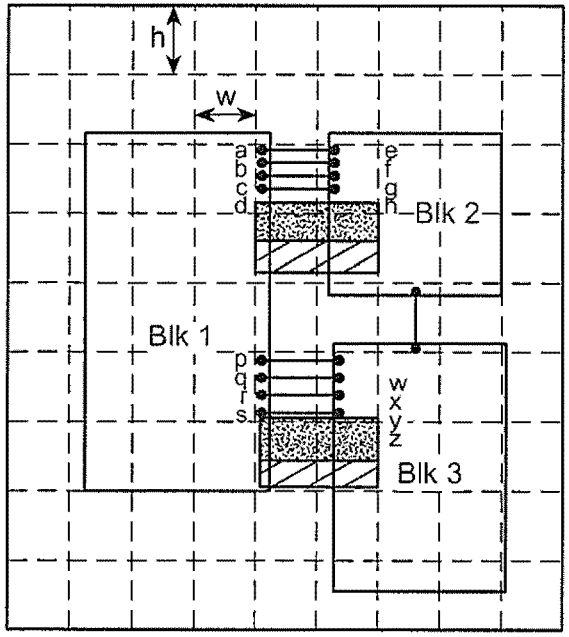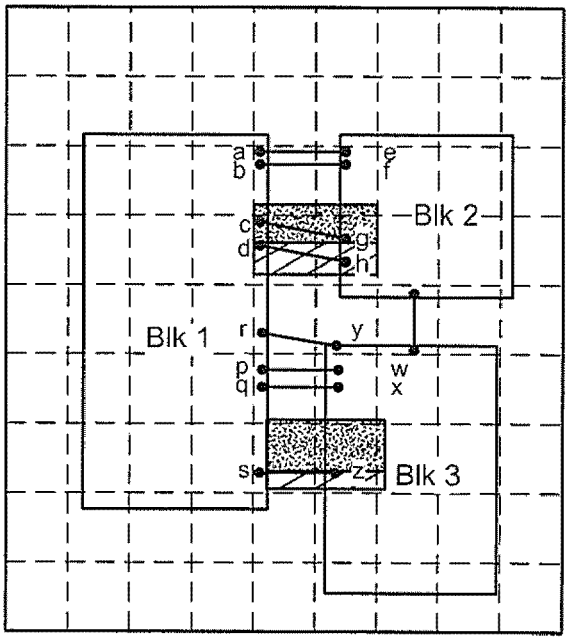
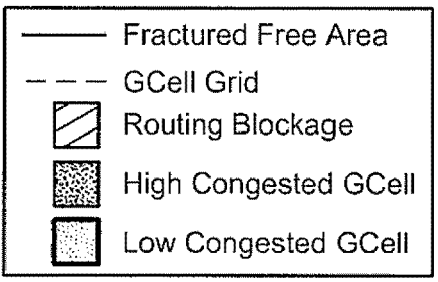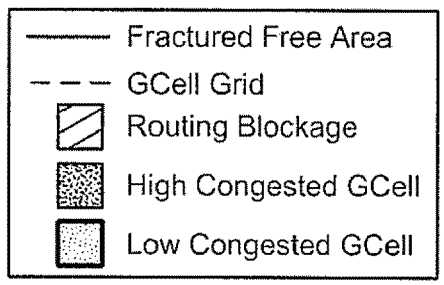
GCells Modeled as
Routing Blockages
*FIG. 10A*
Pins After Congestion
Aware Pin Optimization
*FIG. 10B*

CONGESTION AWARE PIN OPTIMIZER

BACKGROUND OF THE INVENTION

1. Field of Invention

The present invention generally relates to integrated circuit ("IC") and electronics design processes and electronic design automation tools. More specifically, the present invention relates to automated IC design data and, more specifically, to routing congestion removal during pin optimization, particularly for custom IC design.

2. Description of Related Art

A typical custom design flow 100 is shown in FIG. 1. After design entry 101, layout generation 103 and initial design 105 follow floorplanning. As shown in FIG. 1, the floorplanning stage 107 includes block placement 109 and pin optimization 111. During pin optimization 111, pins of blocks and top level design blocks are placed based on connectivity to minimize the overall wire length. Even though the wire length is minimized in this process, many times the pin optimization results in hot spots (highly congested areas) in order to minimize wire-length. Global routing 113 provides the congestion data in the design. If there are high congestion areas in the design 115, then the designer will either manually re-position the pins 117 or, alternately, restart pin optimization on selected pins with a new set of constraints until the level of congestion is acceptable and continuing on 119.

There does not currently exist any solution in the custom IC design domain to consider congestion during pin optimization. Hence it is a repetitive task to run the global router and re-position pins manually to minimize congestion in the design in order to get the desired results.

SUMMARY OF INVENTION

A circuit design process for the reduction of routing congestion is presented that includes a block placement operation, an initial pin optimization for the block placement, and global routing based upon the initial pin optimization. Congestion data is generated from the global routing and, in an automated process, the pins are re-optimized, based upon the congestion data. In other aspects, this process can be implemented as a computer program product, on a system for a design process, or a combination of these.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DRAWINGS

FIG. 4 shows the free space in the design for one example.

FIG. 5 illustrates the GCell and congestion data corresponding to FIG. 4.

FIG. 10 illustrates congestion aware pin optimization for the example of FIG. 4.

Figure 16:
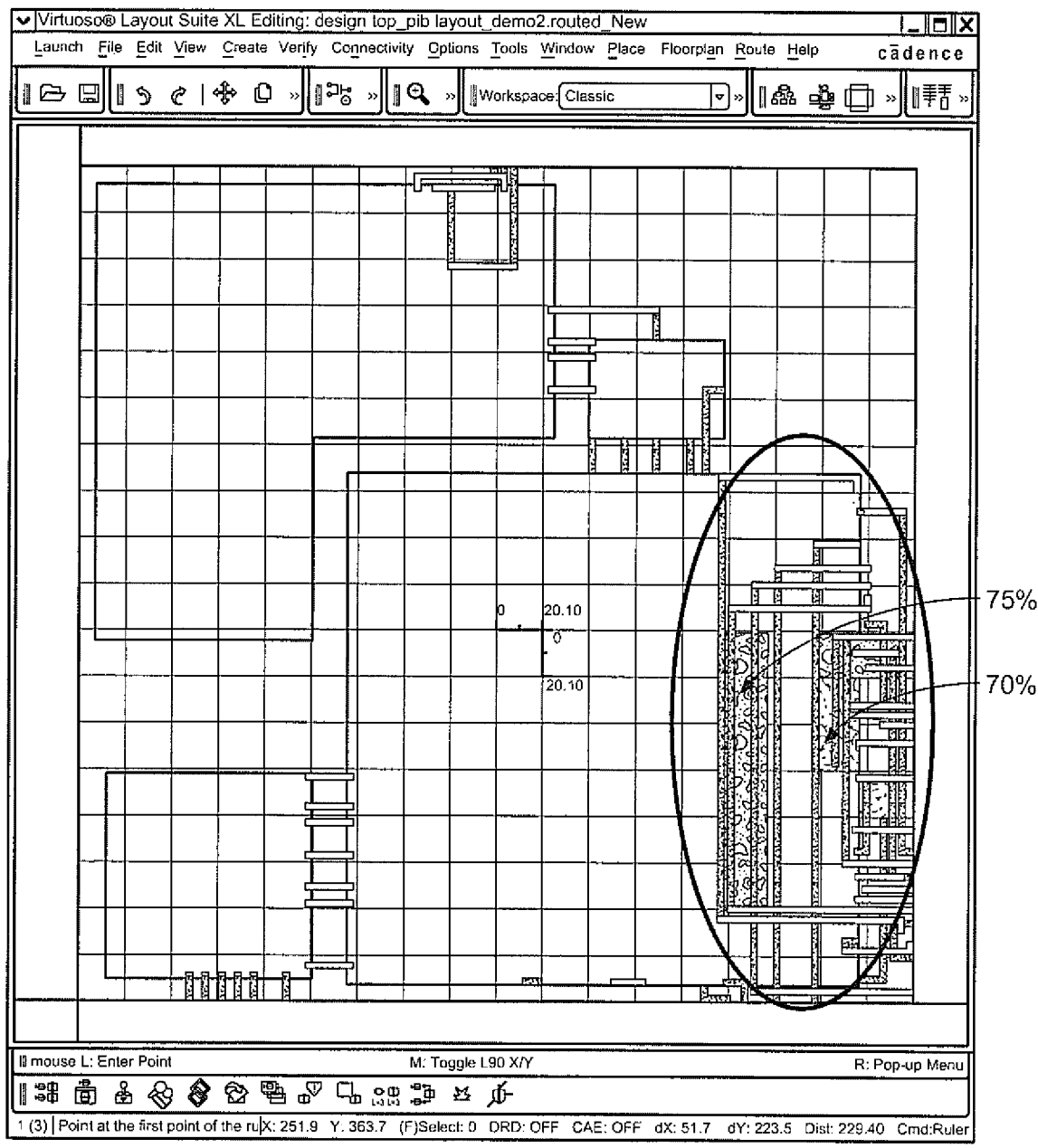

FIG. 16 has the routed design with congestion data with smaller GCell size.

Figure 17:
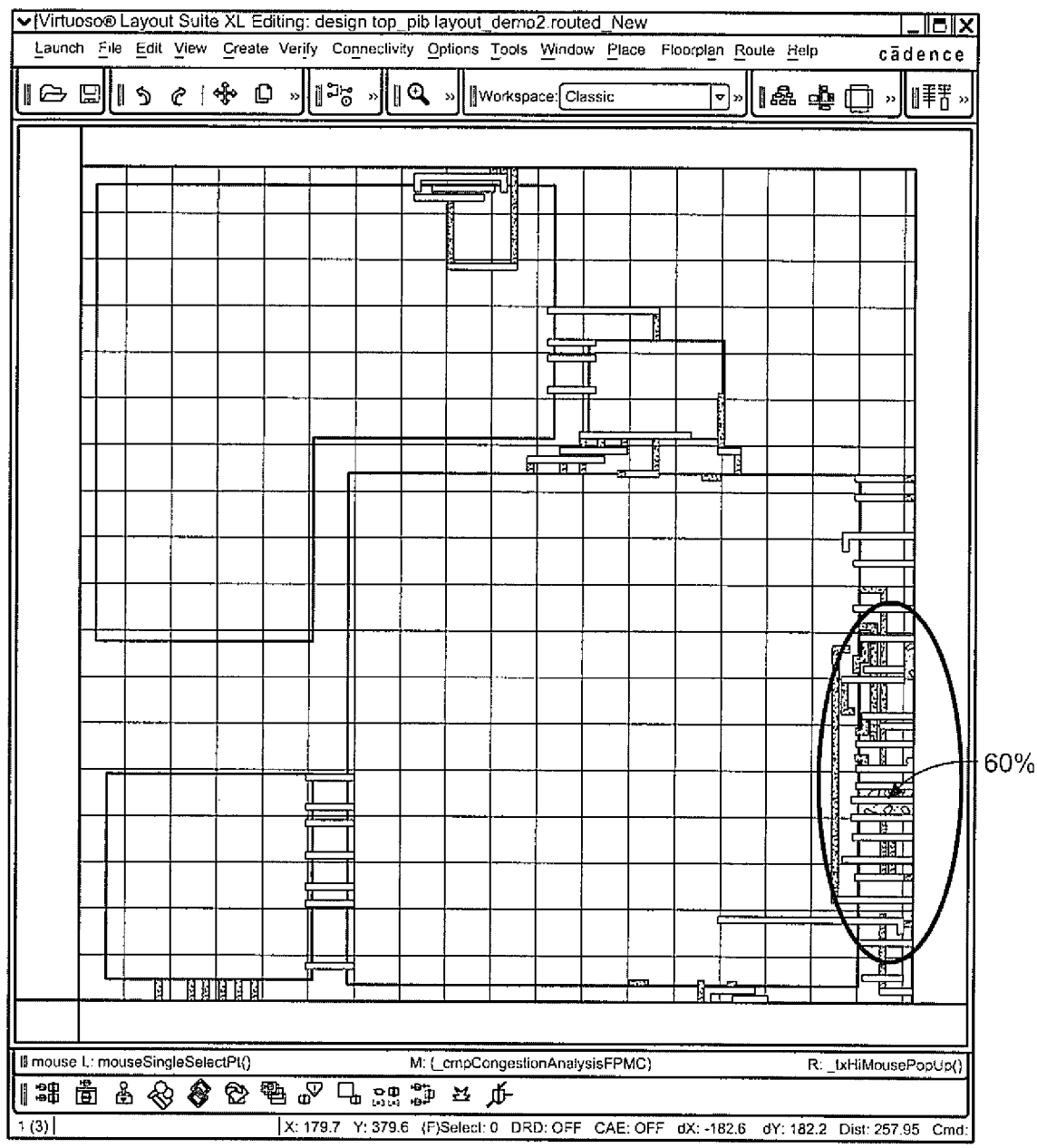

FIG. 17 shows the routed design after running congestion aware pin optimizer.

DETAILED DESCRIPTION

Overview

Design complexities have increased at lower process nodes, and such complexities require elimination of congestion hot spots from physical implementation as early as possible. It is also important to analyze congestion at each stage in the design process so that it does not become a hindrance later in the mixed signal flow. Also faster convergence of designs is important. In the custom IC design domain, pin optimization is an important step during the floorplanning of the design. Pin optimization is an automatic engine which adjusts the pins of the soft blocks (i.e., blocks created during floorplanning that are not precisely fixed and include closely associated design blocks) to reduce the wire length between the blocks. During routing stage it might so happen that the router is not able to route the design properly because of many congested regions. Because of this, it would be useful to consider the routing congestion while doing pin optimization which comes much early in the design cycle.

The techniques presented here consider the routing congestion during pin optimization. Pins are placed appropriately to avoid high congestion areas, which helps in improving the design routability of a mixed signal design. This placement reduces the need for the manual iterations between the global router and pin optimization described in the Background, providing an automatic way of detection of congested areas during the pin optimization itself.

Figure 1:
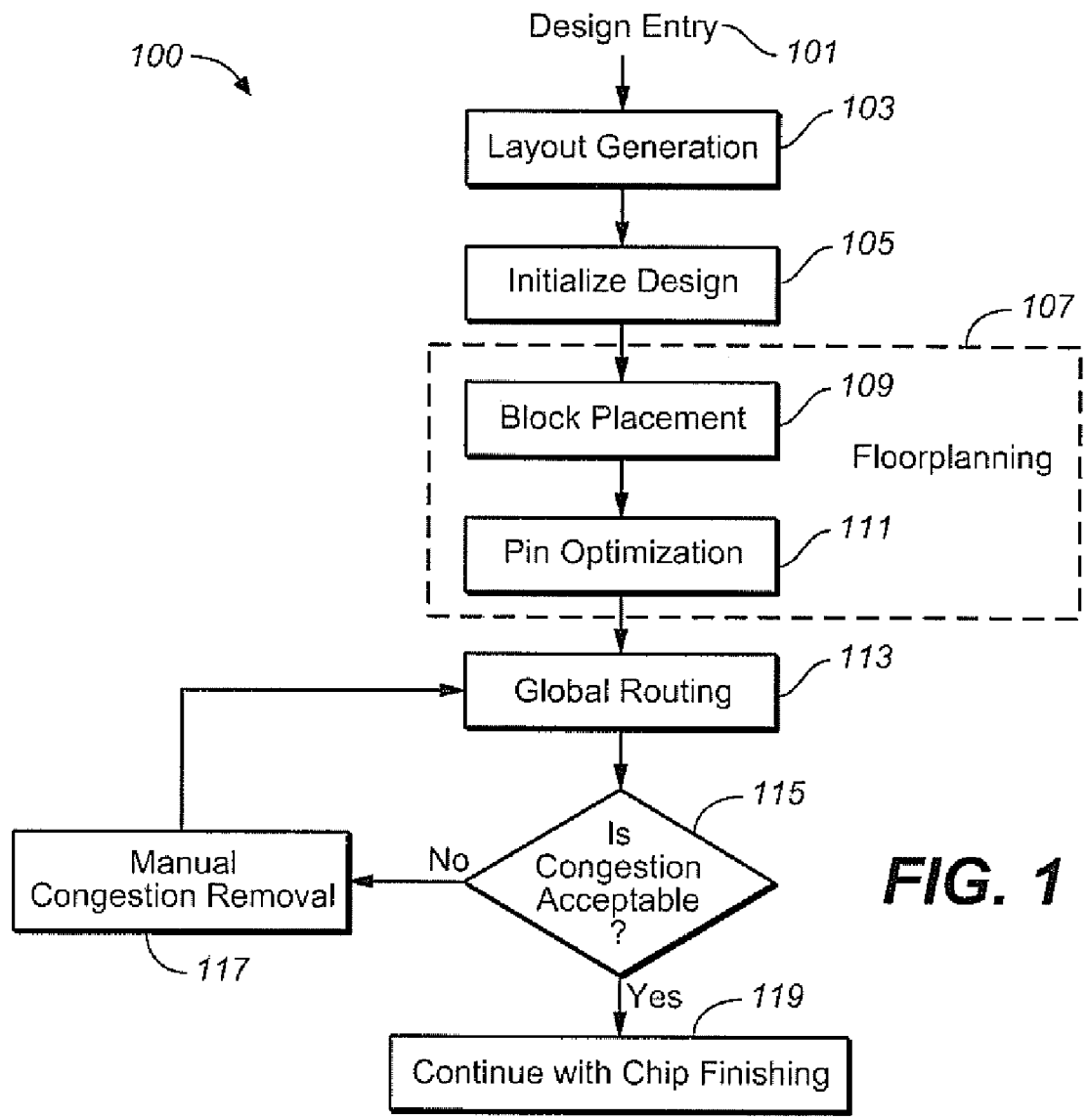
FIG. 1 shows a typical custom design flow.
Figure 2A:
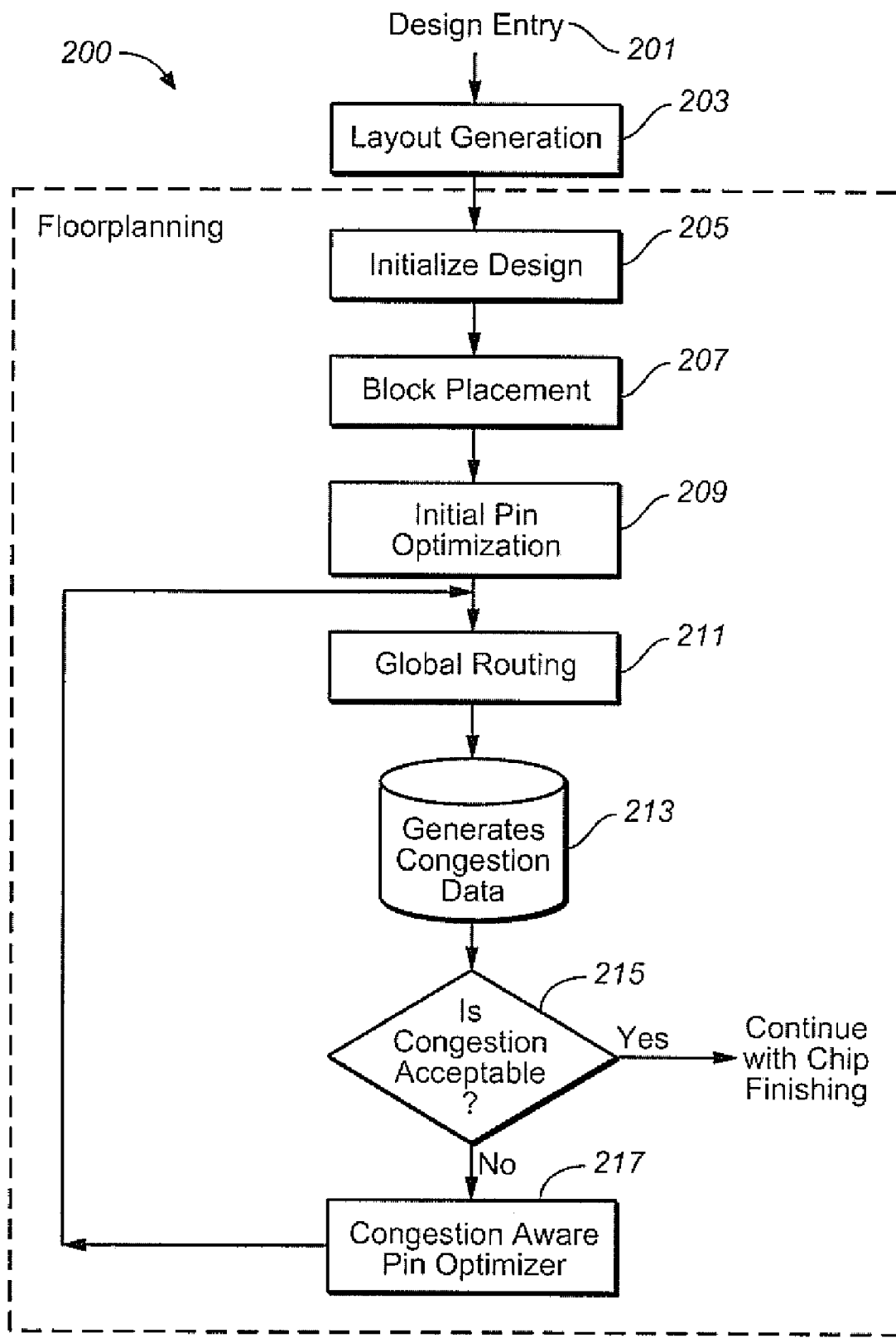
FIGS. 2A and 2B show an exemplary embodiment for a congestion aware pin optimization flow.

FIG. 2A shows an exemplary embodiment 200 for a congestion aware pin optimization flow, beginning with design entry at 201. Once the layout is generated at 203, the design is initialized at 205 and block placement 207 is done so that blocks are placed inside the design boundary. After block placement, the initial pin optimization 209 is run, and congestion data is generated 213 during global routing 211. Congestion data is then analyzed at 215, and if there are high congestion areas in the design (No from 215), then pin optimizer 217 is run in congestion aware mode to reposition pins and reduce the congestion.

Figure 3:
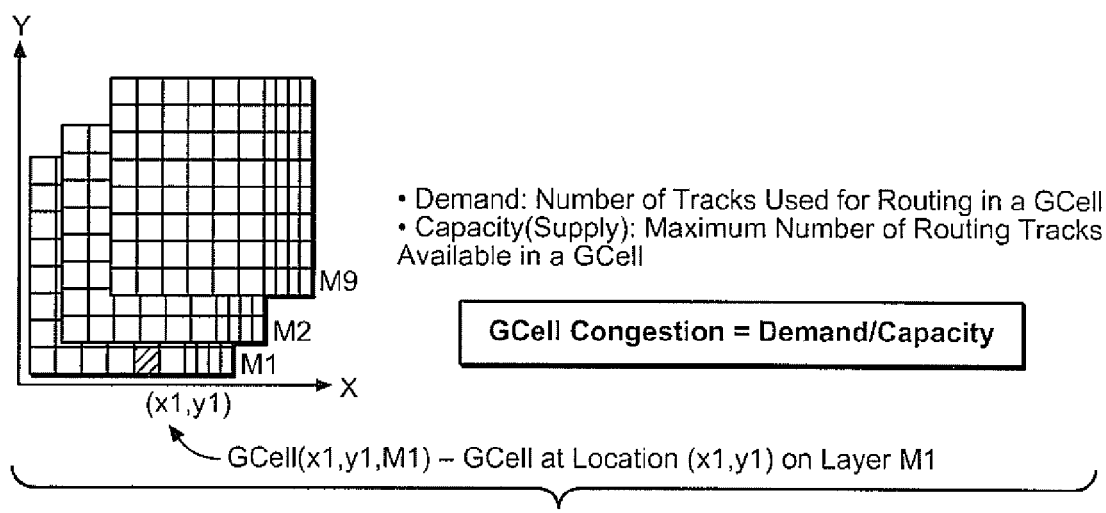
FIG. 3 illustrates the concept of a congestion map.

The determination of whether there are high congestion areas can be done by analyzing if there are highly congested "GCells". In this exemplary embodiment, the global router can present the congestion data in terms of GCells and a congestion map. A congestion map is a two dimensional grid (possibly non-uniform) that exists for each layer in the design. Each Grid cell is called a GCell. A GCell stores the data used to compute the congestion of the design area it covers. For each direction (Vertical, Horizontal) the congestion data can then be computed as shown in FIG. 3. The routing of the design is done in two stages, i.e., global routing and detailed routing.

During the global routing step, approximate track assignment is done, and the router is used for global routing, which generates the congestion data. Congestion data are generated as a ratio of demand and capacity (supply). The design is partitioned into GCells, and congestion is computed for every GCell for every routing layer in both the directions (i.e., horizontal and vertical). Once an acceptable congestion level is reached, the detailed routing process, during which actual wires are laid down based on track assignment, is done during global routing.

Referring back to FIG. 2A, the exemplary embodiment can include a number of features shown there. These include the reading the congestion data from the design and analyzing the congestion data. Additionally, the process 200 performs the identification of the GCells having a congestion value greater than a target value for congestion, which can be specified by the designer; for example, if a GCell has an actual congestion value of 120% on Metal M1 layer, but has a target value of 70%, then such a GCell would be identified. The generated data can then be used to reduce congestion by re-spacing the pins or moving the pins to areas of lesser congestion. Additional, the process 200 can respect the design constraints. The various steps of process 200 of FIG. 2A will be explained in more detail in the following sections through graphically using simple examples.

As can also be seen from the exemplary embodiment of FIG. 2A, the routing congestion is measured by a global router. The congestion aware pin optimizer then uses congestion data generated by the global router. In this algorithm the pin position is revised depending upon the available congestion data after global routing. This is done in such a way that the congestion level reduces to the desired level, which is user specified in a typical embodiment. As opposed to the prior art, which would require the manual removal of congestion by the user, this is an automatic process, which uses congestion data during re-optimization to re-position pins to reduce congestion hot spots without modifying design constraints.

Note that in the exemplary embodiment of FIG. 2A, after initial pin optimization, global routing is done to see if the congestion is acceptable. If it is acceptable ("Yes" out of 215), it then proceeds for chip finishing, so that nothing needs to be done for congestion aware pin optimization. When the congestion is not acceptable ("No" out of 215), the congestion aware pin optimization 217 is executed to change the positions of pins so as to remove congestion. The user can check reduced congestion by running the global router.

Generation of Congestion Data

Figure 2B:
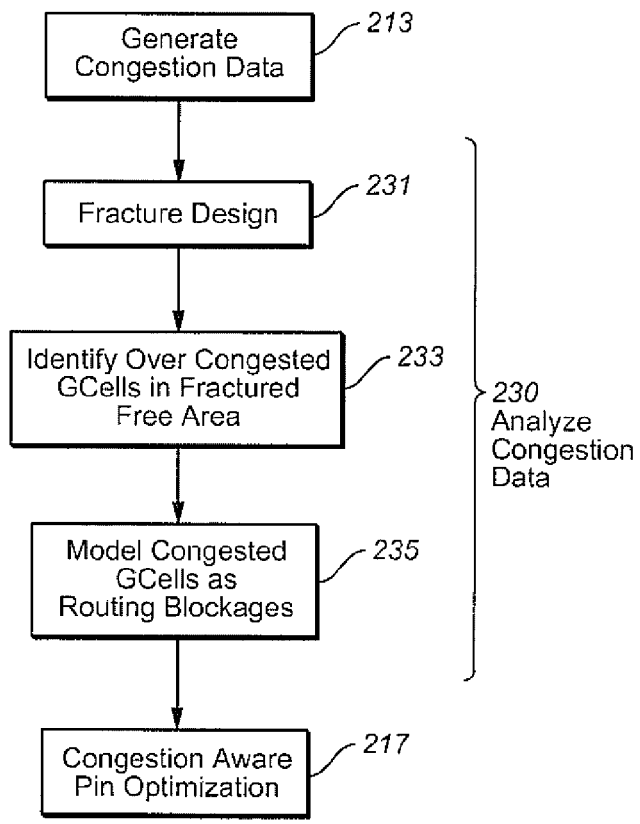

To illustrate the concepts, an example, which may not be the actual design, is considered. As shown in FIG. 4, the design consists of 3 blocks (Blk1 401, Blk2 402, and Blk3 403) which are connected together. On the right, FIG. 4(b) shows the free space in the design, i.e., the space which is not occupied by the blocks. This free space is used by the router to route the design. Hence, it is important to utilize this free space efficiently. Too much of free space is not desired as it will increase die size, which in turn will increase the cost; conversely, too much restriction in this space will lead to routing congestion and will in turn lead to a congested design. FIG. 4 (a) shows that pins are optimized (initial optimization 209 of FIG. 2A) on the design. If the global router is run at this point, it provides information about the congested GCells. FIG. 2B provides more detail of the process leading from the generation of congestion data 213 to the congestion aware pin optimization 217 for the case when the congestion from the initial optimization 209 is not acceptable.

FIG. 5 illustrates the GCell and congestion data corresponding to FIG. 4. As shown in FIG. 5, the whole design is divided into small cells called GCells. The router tags every GCell with a congestion value. The shaded GCells 411 and 413 are highly congested and need more immediate attention, while the non-shaded GCells 421 and 423 are less congested as compared to 411 and 413 and are relatively safe. This differs from the typical prior art in the usage of this congestion data efficiently by pin optimizer to reduce the congestion while respecting the design constraints.

Analysis of Congestion Data

Figure 13:
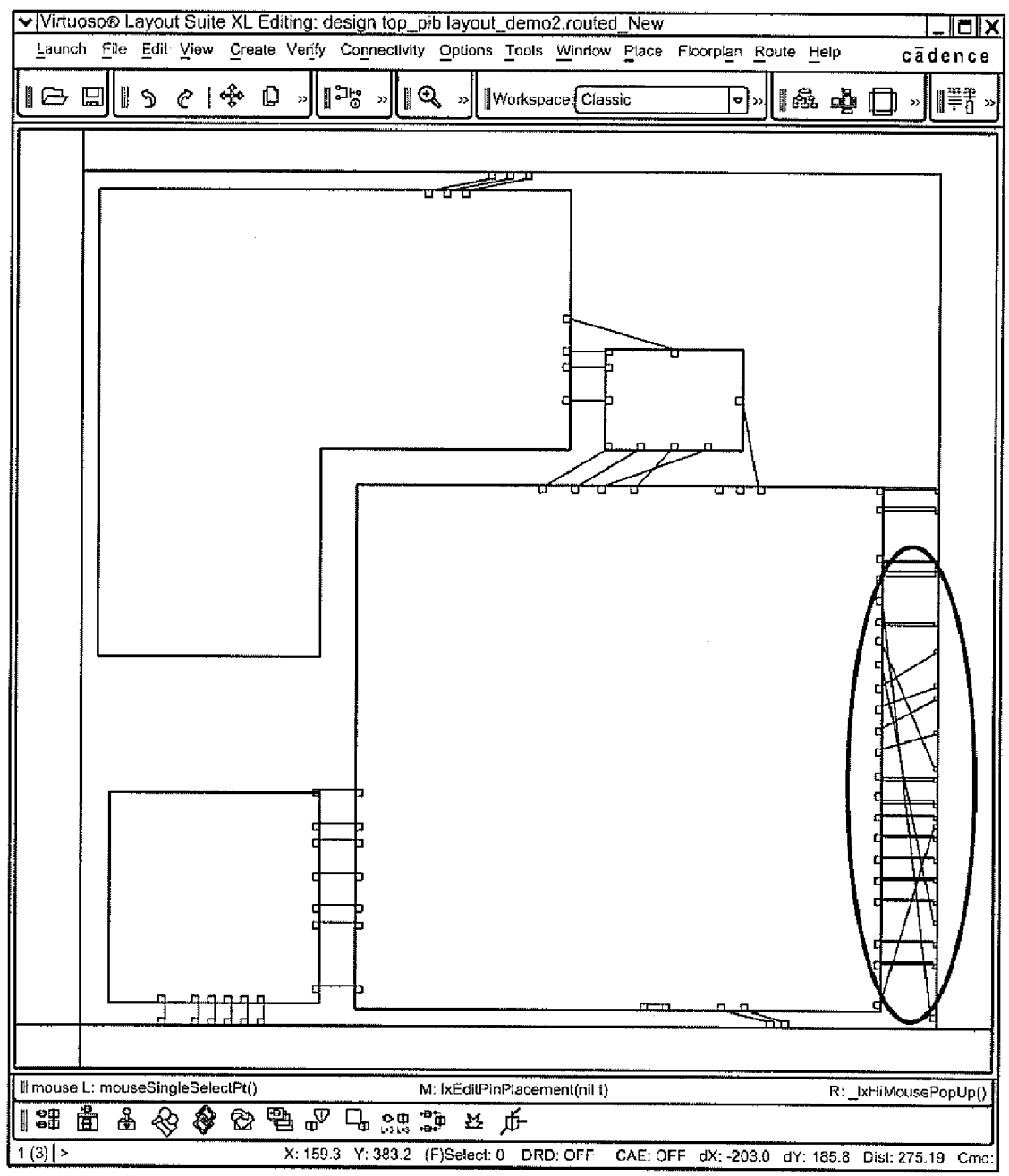
FIG. 13 shows a design after initial pin optimization is done and before running global routing.
Figure 14:
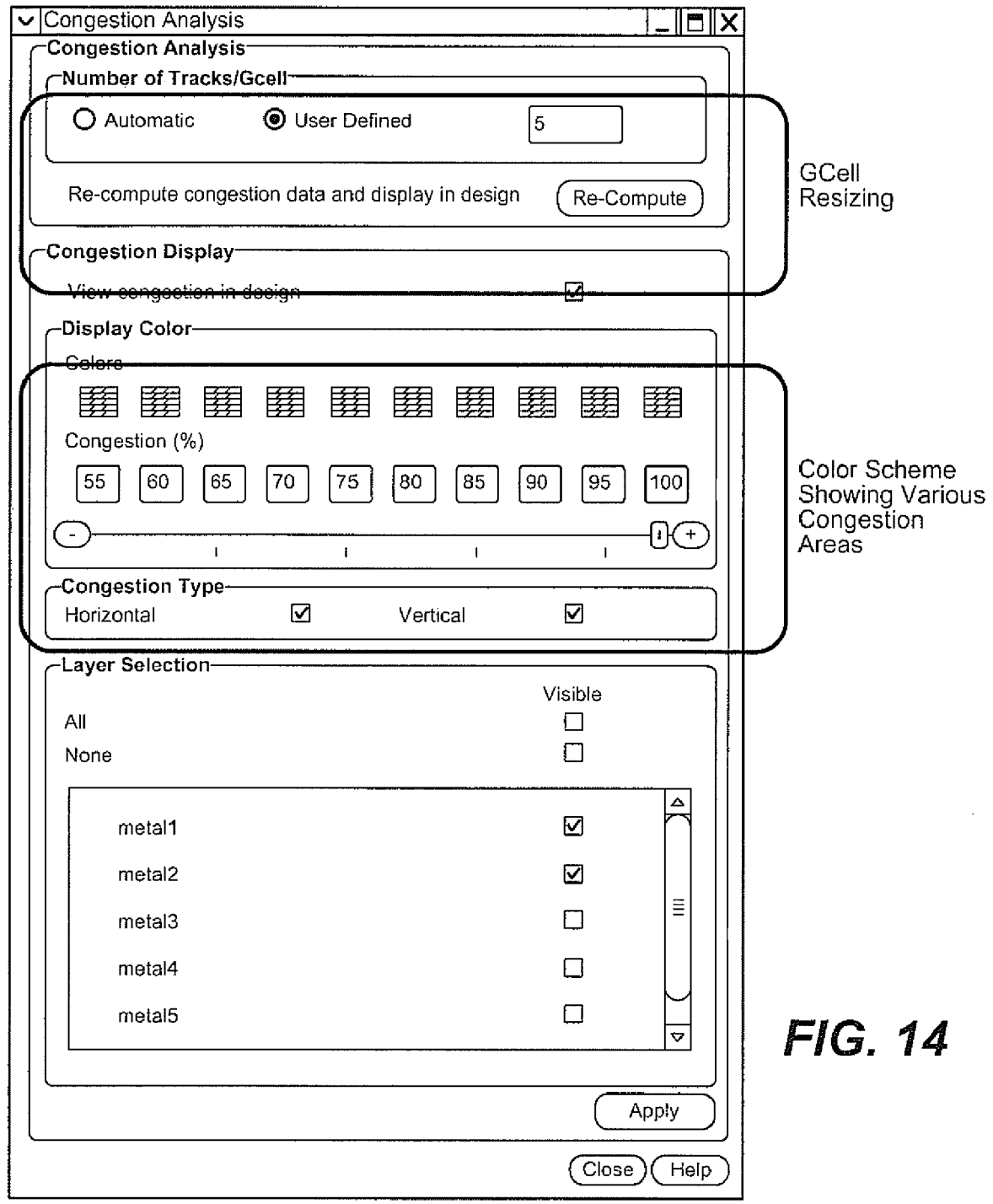
FIG. 14 shows a congestion analysis graphic user interface.
Figure 15:
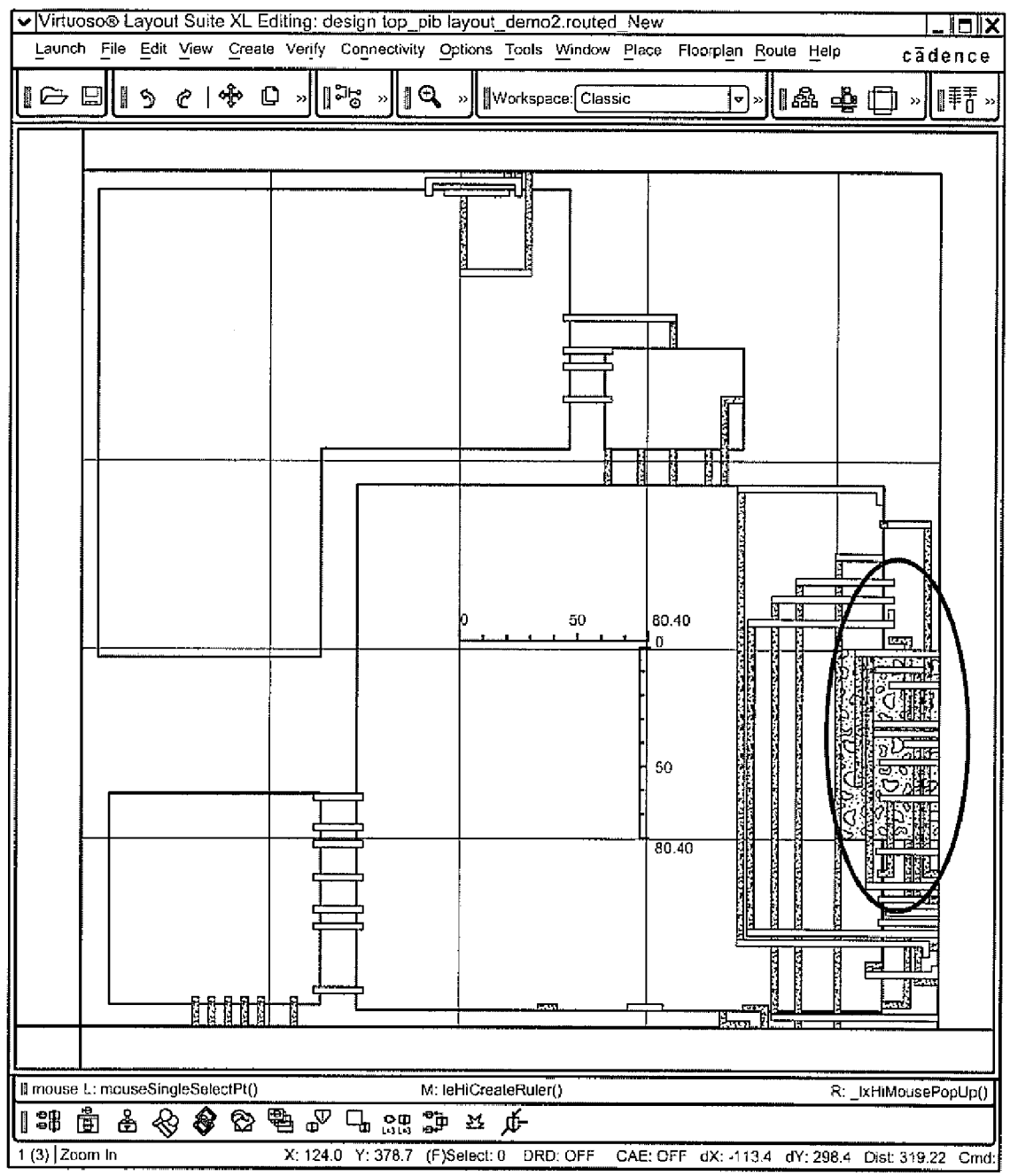
FIG. 15 illustrates a routed design that shows congestion with larger GCell size.

Once the congestion data are generated, they can be analyzed. As shown at shown in FIG. 2B at 230, the exemplary embodiment uses the processes of the following sections. This can be done using the congestion display tools used in conjunction with the congestion aware pin optimizer. If the GCells are big in size, they can be resized to get more granular congestion data. FIGS. 13-15 will explain in some detail below how to resize the congestion GCells and recompute the congestion data.

Fracturing the Design

Once the congestion data is available, identification of relevant congested GCells from the sea of GCells is a challenging task. Traversing all the GCells in the design is typically not an advisable solution as it will have an impact on performance. Also, the GCells which lie inside the block boundary are of little use, as the pin optimizer can only optimize pins on the boundary of the block and not within the block boundary. Hence a special mechanism is desirable to identify the over congested GCells which lie in the free space.

Figure 6A:
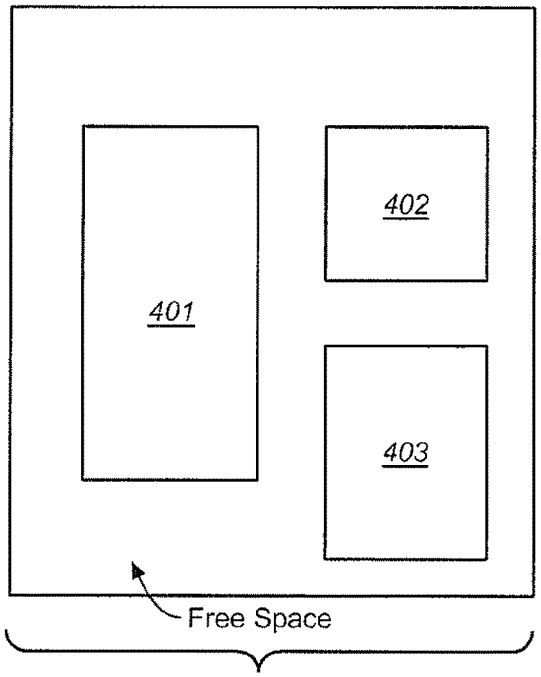
FIG. 6 shows the free space fracturing for the design corresponding to the design of FIG. 4.
Figure 6B:
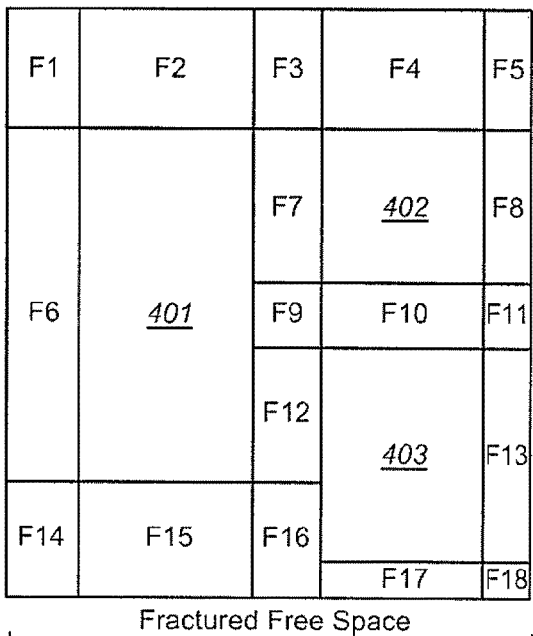

To solve this problem, the free space is computed in the design and is then sliced up using horizontal and vertical cut partitioning to get small, rectangular partitions to fracture the design at 231 of FIG. 2B. This approach is shown in FIG. 6, where the free area in the design of FIG. 4 is sliced up into smaller rectangular sections. This slicing is called "fracturing" of the design. FIG. 6A shows the free area of the design, which is as previously shown FIG. 4A. FIG. 6B shows the rectangular fracturing of this free space into the free areas F1, F2, . . . F18, that are the fractured free spaces.

Fracturing and free space, along with GCells and many of the other concepts used here are also developed in a US patent application entitled "Congestion Aware Block Placement" by Sanjib Ghosh, Vandana Gupta, Hitesh Marwah, Mahendra Singh Khalsa and Pawan Fangaria, filed on the same day as the present application, which considers automated techniques for other elements of the design flow and which is complementary to the aspects presented here.

Identification of Over Congested GCells in the Fractured Free Area

The next stage in the exemplary embodiment is to iterate on all the fractured shapes generated in the previous step and get the GCells and their corresponding congestion value. GCells which are partially lying in the free space are also considered. For every GCell there might be different congestion values on different layers. For pin optimization, the process iterates over all the layers on a particular GCell and obtains information about the layers having congestion value more than the target congestion value. This identification of the over congested GCells in the fractured area is 233 of FIG. 2B.

Figure 7:
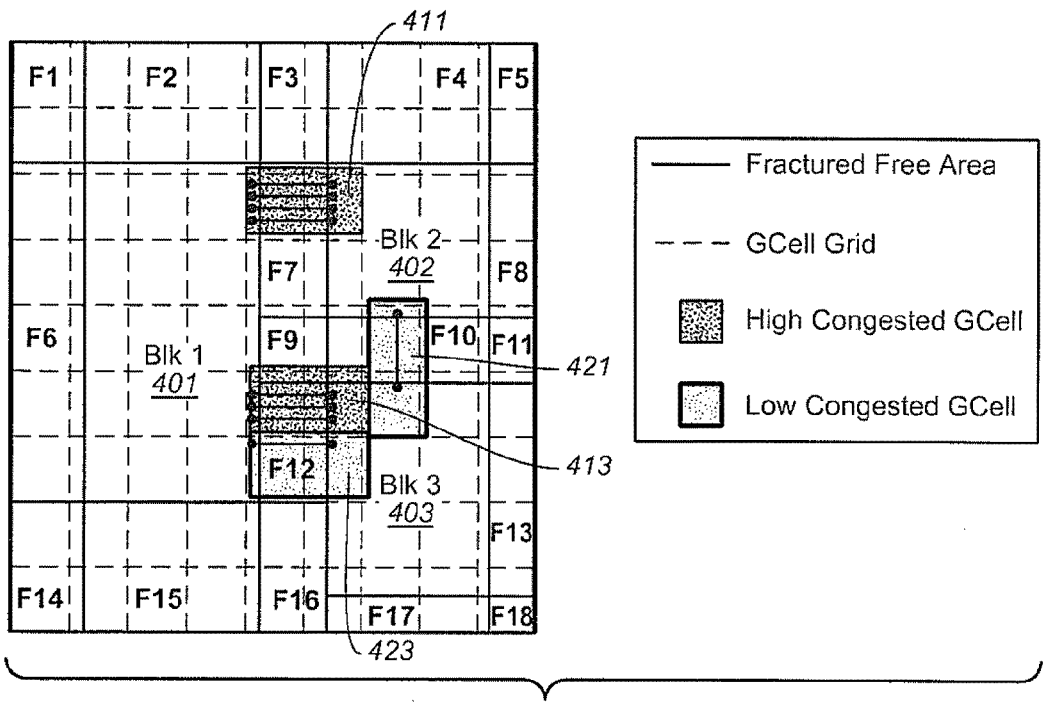
FIG. 7 depicts the GCell grid and GCells which are in the free area for the design of FIG. 4.

An example of some pseudo-code to identify the over congested GCells is as follows:
Input: target congestion
Output: overCongestedGCellArray
Begin:
routingLayers←get all routing layers in the design
For each fractured shape f
GCellArray←get all GCells off
For each GCell g in GcellArray
    For each layer l in routingLayers
Congestion←compute congestion value for g on l
    if(congestion>target congestion)
    then
        add (g, l) to overCongestedGCellArray
    end
end
end
end
return overCongestedGCellArray FIG. 7 depicts the GCell grid and GCells which are in the free area for the exemplary design. FIG. 7 is labeled as in FIG. 5, but with the free space fractured into the free areas F1, F2, . . . F18, as was shown more clearly on FIG. 6B.

Modeling Congested GCells as Routing Blockages

The pin optimizer respects routing blockages and places the pins appropriately to avoid blockages. For congestion aware pin optimization, this feature has been leveraged by modeling high congestion areas as routing blockages at 235 of FIG. 2B.

Once the congested GCells lying in the free space are identified, these can be modeled as routing blockages. The GCell is over congested because number of pins in that particular GCell area is greater and, as a result, more routing tracks are consumed during global routing, thus resulting in high congestion in that GCell. The idea is to reduce the number of pins assigned in that GCell area so that the number of tracks required for global routing reduces, thereby reducing the congestion in that GCell. This operation is done by blocking a part of the GCell to control the number of pins assigned in that area. The routing blockages are created on the all the layers having congestion more than the target congestion value. (Blockages are created internally in the data structures only for the exemplary embodiment.)

Since pin optimizer respects routing blockages it will either: (i) respace the pins on the same edge; or (ii) if there is not enough space on the same edge, it will move the pins to other edge. This whole exercise is done while maintaining the design constraints.

The size of routing blockage is directly proportional to the congestion in GCell. Weighted routing blockage is created depending on the target congestion value and the actual congestion in the GCell.

Case 1: Congestion is Higher in Vertical Direction in a GCell

If the congestion is high in vertical direction, then the routing blockage is created in the vertical direction so that a lesser number of pins can be assigned in that GCell, thereby reducing congestion. For example, if the target congestion value is $C_T$ and the actual congestion value is $C_A$ in a particular GCell, then the dimensions of routing blockage are computed as shown in FIG. 8.

Figure 8:
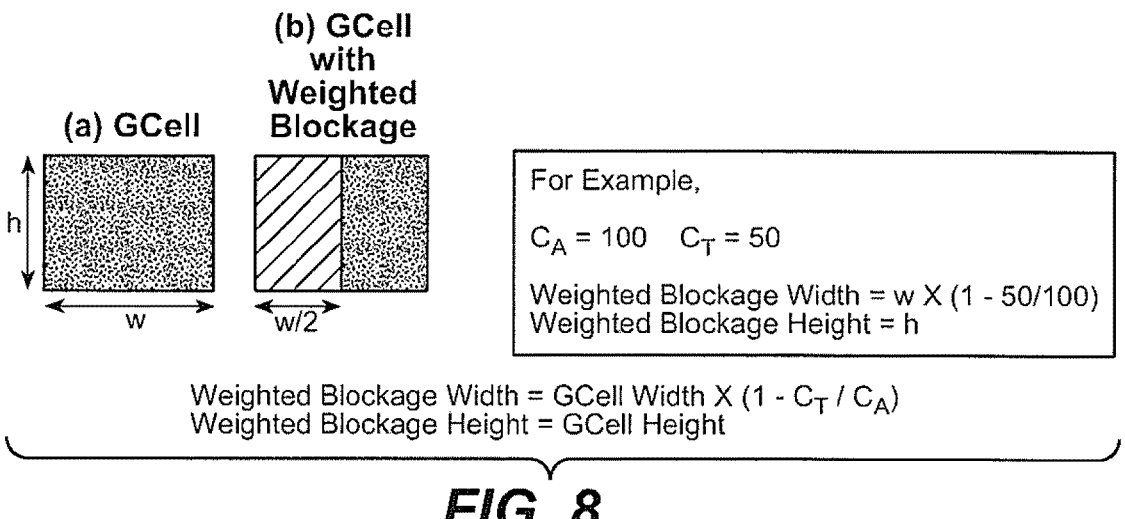
FIG. 8 illustrates weighted blockage creation in the vertical direction.

FIG. 8 illustrates weighted blockage creation in vertical direction for a GCell of width w and height h. Here, $$\text{Weighted Blockage width} = G\text{Cell width} \times (1 - C_T/C_A);$$
and Weighted Blockage height=$G$Cell height.

If, for example, $C_A=100$ and $C_T=50$, then:

$$\text{Weighted Blockage width} = w \times (1 - 50/100), \text{ or } w/2; \text{ and}$$

Weighted Blockage height=$h$, as are shown on the right hand side of FIG. 8.

Case 2: Congestion is Higher in Horizontal Direction in a GCell

Figure 9:
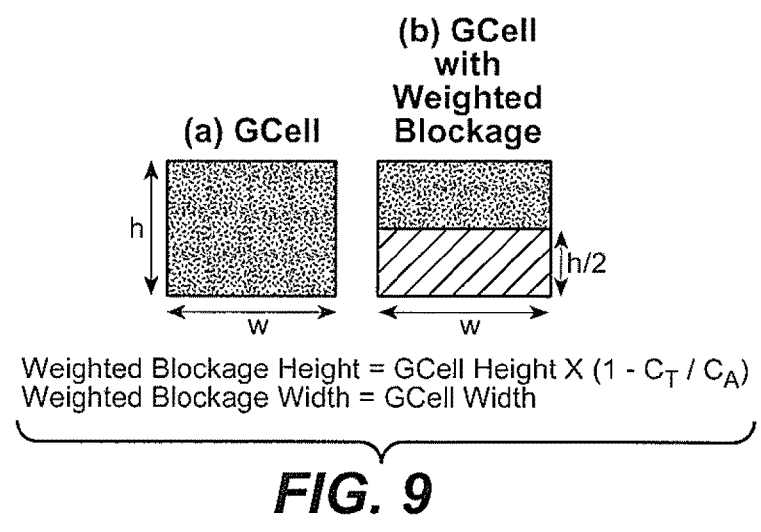
FIG. 9 illustrates weighted blockage creation in the horizontal direction.

If the congestion is high in the horizontal direction, then the routing blockage is created in horizontal direction, so that a lesser number of pins can be assigned in that GCell, thereby reducing congestion. As in Case 1, if the target congestion value is $C_T$ and the actual congestion value is $C_A$ in a particular GCell, then the dimensions of routing blockage are computed as shown in FIG. 9.

FIG. 9 again illustrates weighted blockage creation in vertical direction for a GCell of width w and height h. Here, $$\text{Weighted Blockage height} = G\text{Cell height} \times (1 - C_T/C_A);$$
and Weighted Blockage width=$G$Cell width.

If, for example, $C_A=100$ and $C_T=50$, then:

$$\text{Weighted Blockage height} = h \times (1 - 50/100), \text{ or } h/2; \text{ and}$$

Weighted Blockage width=$w$, as shown on the right hand side of FIG. 9.

Congestion Aware Pin Optimization

Applying the above formula on the design of FIG. 4, routing blockages will be modeled as shown in FIG. 10. As shown in FIG. 10A, the weighted routing blockages are created. The height of the two blockages is different. After the pin optimizer is run in congestion aware mode, the new result is shown in FIG. 10B. As shown in FIG. 10B, the pins are now repositioned away from the routing blockages, which in turn will reduce the routing congestion.

In this particular example, pin pairs, c-g and d-h, are placed in such a way that now they lie in low congestion GCell. These pins have been re-positioned on the same edge. Pin pair r-y are placed are repositioned on a different edge.

Figure 11B:
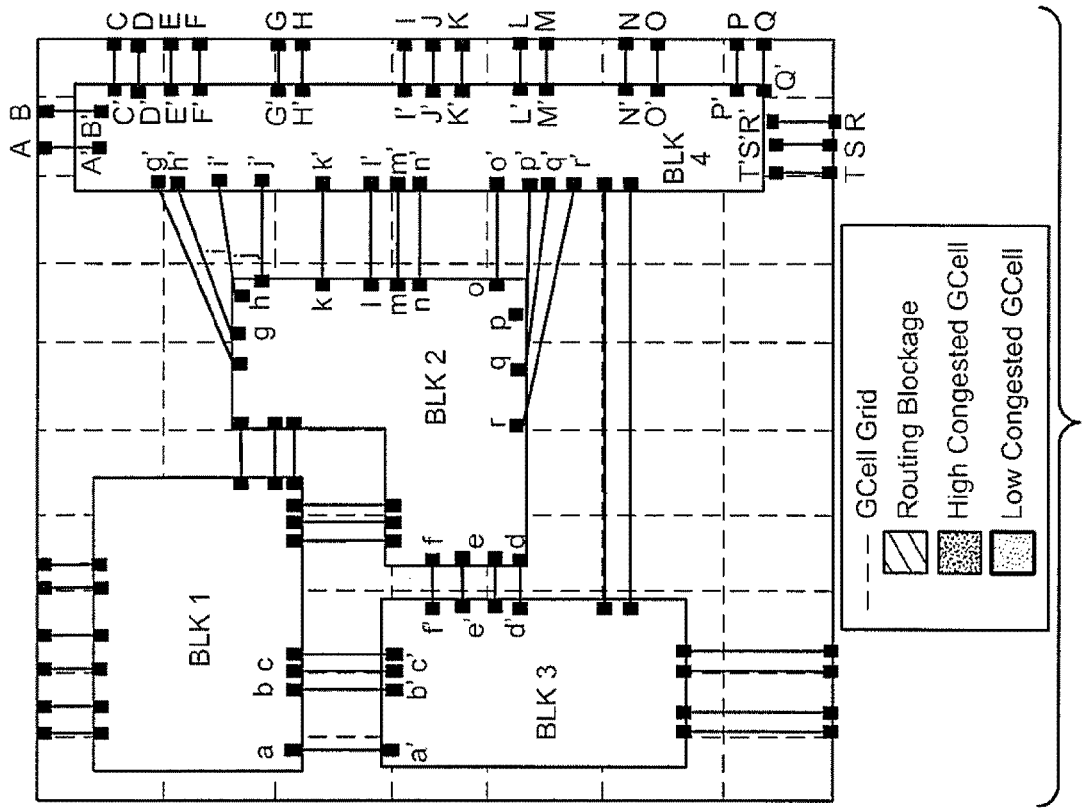
FIG. 11 illustrates congestion aware pin optimization for a more complex example.
Figure 11A:
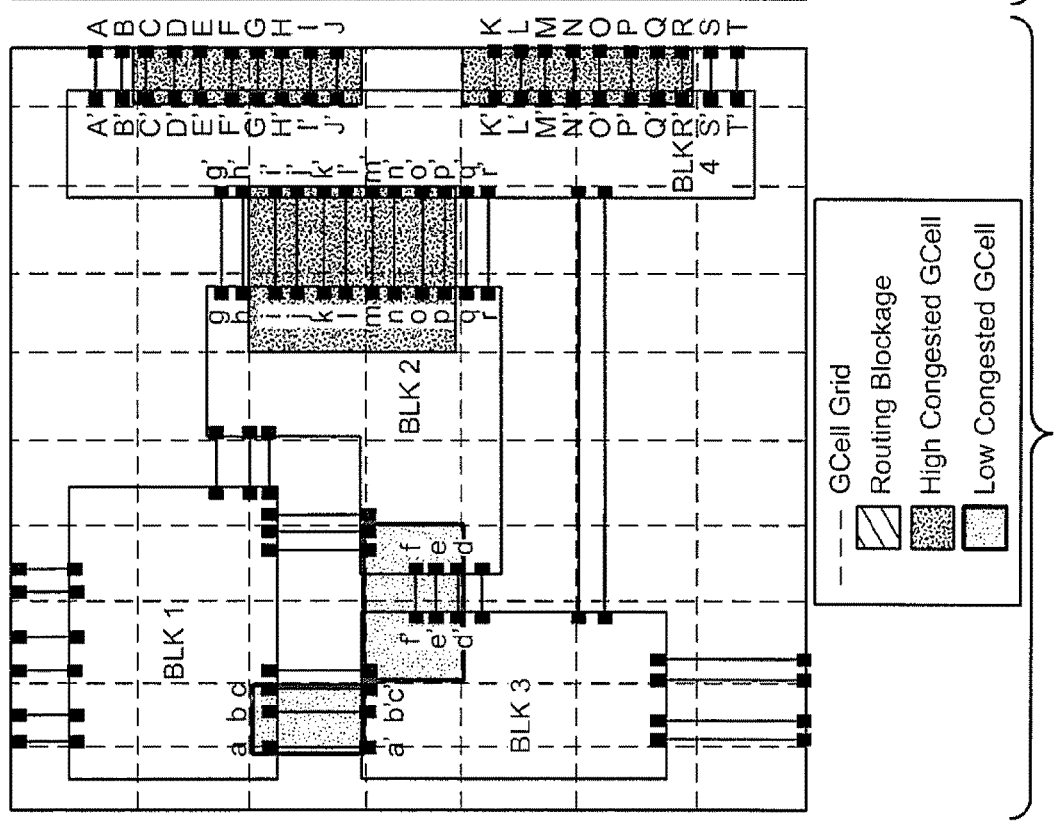

FIG. 11 shows a more complex example with 4 blocks before and after running the congestion aware pin optimization. The before version of FIG. 11A shows there are 4 blocks namely Blk1, Blk2, Blk3 and Blk4. For this example it is taken that the supply is 4 tracks per GCell and that the target congestion is 50%, which implies that there should not be more than 2 pins assigned to each GCell. The GCells through which 4 or more nets are passing are shown in dark shading to indicate high congestion, and GCell from which only 3 nets are passing are shown with light shading to indicate lower congestion. Congestion needs to be reduced in the dark and light shaded regions. To achieve the target congestion, the number of pins in each GCell should be limited to 2.

In FIG. 11A, pins in the darkly shaded regions are pins i-p of Blk2 and pins i'-p' and pins C'-R' of Blk 4 and top levels pins C-R. Similarly, pin pairs a-a', b-b', c-c', d-d', e-e' and f-f' lie in the lightly shaded regions.

FIG. 11B shows the results of congestion aware pin optimizer. As shown in the figure, the pins in high congestion GCells are either moved away from each other on the same edge or have been assigned to a different edge in the block. In the example above pins a' and d' of Blk 3 are re-spaced on the same edge. Pins of the more heavily congested regions like g, h, p, q, r of Blk2 and A', B', T', S', R' of Blk 4 have been assigned to different edge, while the other pins of Blk2 and Blk4 have been re-spaced on the same edge so as to bring down the congestion within the desired limits.

Figure 12:
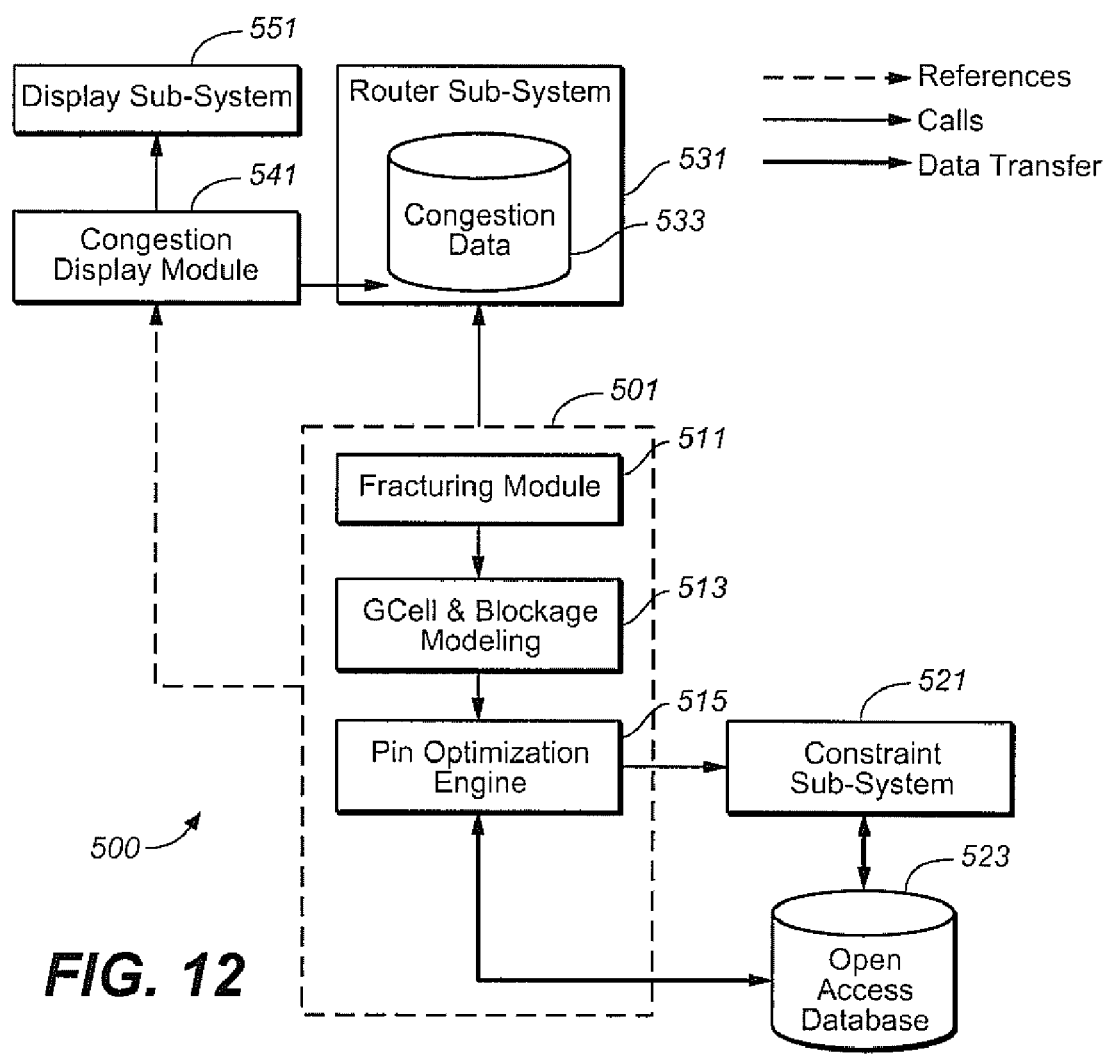
FIG. 12 shows an exemplary code architecture diagram.

FIG. 12 shows an exemplary code architecture diagram 500 to show the relationship of the various modules involved and to illustrate the incorporation of the constraint aware pin optimizer 501 and how it relates to other elements of the architecture. The constraint aware pin optimizer 501 here is shown to include the fracturing module 511, the GCell and blockage modeling 513, and the pin optimization engine 515. The pin optimization engine 515 can put in calls to the constraint subsystem 521, and both of these can exchange data with the open access database. The constraint aware pin optimizer 501 can also put in call to the router subsystem 531, including the congestion data 533, send references to the congestion display module 541. The congestion display module 541 can send calls to the router subsystem 531 and the display subsystem 551.

Relative to the typical prior art process, the techniques described here have a number of advantages, which can be used individually or together. A first of these is the removal of hot spots (over congested cells) during pin optimization stage, thus improving the design routability early in the design cycle. Another advantage is the reduction in the designer's turn around time, since now congestion removal during pin optimization is an automatic process; hence, the designer does not need to do the manual pin adjustment and re-run the router and pin optimizer. Further, previously routing congestion was not removed during pin optimization stage. These techniques also improve the routability of the design, as congestion is removed upfront in the floorplanning stage itself, while maintaining design constraints. By reducing the routing congestion in custom IC design domain, it can also be very useful for mixed-signal design flows where analog/custom and digital co-exist.

Moreover, the advantages of these techniques can be achieved by fracturing the design to get the free space information, in which fracturing increases the performance. All the GCells of the design are not iterated; rather, only the GCells lying in the free space are iterated for identifying the hotspots.

Another aspect is the modeling of highly congested areas as routing blockages. Modeling is done to leverage the existing features of the pin optimizer which respects routing blockage. Pins are repositioned on the same edge or other edges based on spacing, congestion, design constraints and connectivity. Additionally, the congestion aware pin optimization is done without disturbing any existing design constraints. In practice, it has been found that for most cases, the described congestion aware pin optimization removes congestion in only one run of congestion aware pin optimization, corresponding to a single pass through block 217 of FIGS. 2A and 2B.

Exemplary Embodiment

FIGS. 13-17 can help to illustrate various stages of FIG. 2A within a system for circuit simulation in which these techniques are implemented as software, for example. These figures show the display on a user's computer, that, along with the usual input devices (keyboard, mouse, etc.) serve as a user interface during the congestion aware pin optimization process.

FIG. 13 shows the design after initial pin optimization is done and before running global routing. At this stage, block placement and initial pin optimization has already been done, the pins are optimized without congestion information. The global router can then be run and congestion data visualized. To visualize the congestion, the design of the exemplary embodiment provides a congestion analysis graphic user interface (GUI). FIG. 14 shows an example of such a congestion analysis GUI.

The routed design with congestion is shown in FIG. 15. In FIG. 15, the GCells are also seen. The GCells with high congestion can be shown in different color as chosen from the display (see FIG. 14). As shown in FIG. 15, the GCell grid is very large (80 units×80 units). The congestion display tool (GUI) shown in FIG. 14 provides a mechanism to alter the size of GCell without re-running the global router. This mechanism will help the designer to analyze the congestion with more granularity. FIG. 16 below shows the new congestion region after reducing the size of GCell to 20 units×20 units.

Once the congestion data is analyzed, the pin optimizer is run to reduce the congestion level and to get target congestion below, say, a 70% congestion value. The routed design with congestion is shown in FIG. 17. As can be seen in FIG. 17, there is no congestion in the design as compared to FIG. 16, demonstrating the result of congestion aware pin optimization. A single run of the congestion aware pin optimization has achieved this result, earlier several GCells were congested with more than 70% congestion and after running congestion aware pin optimizer few GCells are remaining with even 60% congestion value.

CONCLUSION AND GENERALIZATIONS

Although described above with respect to specific examples and embodiments, the techniques given here are more generally applicable. Since the congestion-aware pin-optimizer is modular in nature, its various modules, like free-space fracturing, can be re-used in other domains. This invention can be used in the printed circuit board (PCB) domain, where passive components exist in the design which may result in congestion hot spots during PCB planning. Various modules of the congestion aware pin optimization can be leveraged in PCB domain to analyze and reduce congestion early in the design cycle. Congestion aware pin optimization can also be used effectively in Digital IC design and Mixed-signal System-On-Chip where complex space modeling is required as there are irregular free areas in many designs, which can not be divided in rows alone. The fracturing module can be utilized to analyze and remove congestion.

Many aspects of the methods of the present invention will most commonly be implemented in software as a set of instructions for a computer program product, although many of these can be implemented in hardware or by a combination of software and hardware. For instance, FIG. 17 is an example of a presentation on a display of a computer system running such a software product. Further, the different operations described may be executed in various orders, or using different specific products, other than those of the embodiments while still maintaining various aspects of the present invention. As will be understood in the art, the invention or components thereof may be embodied in a fixed media program component containing logic instructions and/or data that when loaded into an appropriately configured computing device cause that device to perform according to the embodiments of the invention. As will be understood in the art, a fixed media program may be delivered to a user on a fixed media for loading in a user's computer or a fixed media program can reside on a remote server that a user accesses through a communication medium in order to download a program component. Examples of such fixed media include a disk-type optical or magnetic media, magnetic tape, solid state memory, etc. Embodiments of the invention may be embodied in whole or in part as software recorded on this fixed media.

Although the various aspects of the present invention have been described with respect to certain embodiments, it is understood that the invention is entitled to protection within the full scope of the appended claims.

It is claimed:

1. In a circuit design process, a method of reducing routing congestion, comprising:
    performing a block placement operation;
    performing an initial pin optimization for the block placement;
    performing global routing based upon the initial pin optimization;
    generating congestion data from the global routing; and
    in an automatic process, re-optimizing pins based upon the congestion data, wherein one or more pin locations are moved with respect to their block locations from the initial pin optimization.

2. The method of claim 1, further comprising:
    determining, based upon the congestion data, whether a level of congestion is acceptable, wherein the re-optimizing the pins is performed in response to determining that the level, of congestion is not acceptable.

3. The method of claim 1, further comprising:
    updating the congestion data for the re-optimized pins using the global routing; and
    determining, based upon the updated congestion data, whether a level of congestion is acceptable.

4. The method of claim 3, further comprising:
    in response to determining that the level of congestion is not acceptable, running a pin optimization based upon the updated congestion data; and
    in response to determining that the level of congestion is acceptable, continuing with chip finishing.

5. The method of claim 1, wherein the design process is for a custom layout design process.

6. The method of claim 1, wherein said re-optimizing the pins includes:
    identifying cells in the design having a congestion value exceeding a user provided target value; and
    re-spacing pins for cells exceeding the target value.

7. A computer program product to reduce routing congestion in a circuit design process, including a storage device comprising executable instructions, the computer program product comprising instructions for performing a method including:
    performing a block placement operation;
    performing an initial pin optimization for the block placement;
    performing global routing based upon the initial pin optimization;
    generating congestion data from the global routing; and
    in an automatic process, re-optimizing pins based upon the congestion data, wherein one or more pin locations are moved with respect to their block locations from the initial pin optimization.

8. The computer program product claim 7, wherein the method further includes:
    determining, based upon the congestion data, whether a level of congestion is acceptable, wherein the re-optimizing the pins is performed in response to determining that the level of congestion is not acceptable.

9. The computer program product claim 7, wherein the method further includes:
    updating the congestion data for the re-optimized pins using the global routing; and
    determining, based upon the updated congestion data, whether a level of congestion is acceptable.

10. The computer program product claim 9, wherein the method further includes:
    in response to determining that the level of congestion is not acceptable, running a pin optimization based upon the updated congestion data; and
    in response to determining that the level of congestion is acceptable, continuing with chip finishing.

11. The computer program product claim 7, wherein the design process is for a custom layout design process.

12. The computer program product claim 7, wherein said re-optimizing the pins includes:
    identifying cells in the design having a congestion value exceeding a user provided target value; and
    re-spacing pins for cells exceeding the target value.

13. A system for a design process of an integrated circuit containing multiple devices, comprising:
    a user interface for viewing representations of the integrated circuit on a display; and
    at least one processing unit including circuitry to a perform a process to reduce routing congestion in a circuit design process, the process including: performing a block placement operation; performing an initial pin optimization for the block placement; performing global routing based upon the initial pin optimization; generating congestion data from the global routing; and re-optimizing pins based upon the congestion data, wherein one or more pin locations are moved with respect to their block locations from the initial pin optimization.

14. The system of claim 13, wherein the process further includes:
    determining, based upon the congestion data, whether a level of congestion is acceptable, wherein the re-optimizing the pins is performed in response to determining that the level of congestion is not acceptable.

15. The system of claim 13, wherein the process further includes:
    updating the congestion data for the re-optimized pins using the global routing; and
    determining, based upon the updated congestion data, whether a level of congestion is acceptable.

16. The system of claim 15, wherein the process further includes:
    in response to determining that the level of congestion is not acceptable, running a pin optimization based upon the updated congestion data; and
    in response to determining that the level of congestion is acceptable, continuing with chip finishing.

17. The system of claim 13, wherein the design process is for a custom layout design process.

18. The system of claim 13, wherein said re-optimizing the pins includes:
    identifying cells in the design having a congestion value exceeding a user provided target value; and
    re-spacing pins for cells exceeding the target value.

* * * * *